(12) United States Patent
Chung et al.

(10) Patent No.: US 11,005,060 B2
(45) Date of Patent: May 11, 2021

(54) ELECTROLUMINESCENT DEVICE, AND DISPLAY DEVICE COMPRISING THEREOF

(71) Applicant: SAMSUNG ELECTRONICS CO., LTD., Suwon-si (KR)

(72) Inventors: Dae Young Chung, Suwon-si (KR); Moon Gyu Han, Suwon-si (KR); Oul Cho, Suwon-si (KR); Tae Hyung Kim, Seoul (KR); Sujin Park, Seoul (KR); Hongkyu Seo, Anyang-si (KR); Eun Joo Jang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/356,148

(22) Filed: Mar. 18, 2019

(65) Prior Publication Data
US 2019/0326539 A1    Oct. 24, 2019

(30) Foreign Application Priority Data

Mar. 19, 2018   (KR) ................. 10-2018-0031566
Mar. 18, 2019   (KR) ................. 10-2019-0030273

(51) Int. Cl.
*H01L 51/50* (2006.01)
*H01L 51/00* (2006.01)
(Continued)

(52) U.S. Cl.
CPC ...... *H01L 51/5028* (2013.01); *H01L 27/3244* (2013.01); *H01L 33/06* (2013.01);
(Continued)

(58) Field of Classification Search
CPC ... H01L 33/08; H01L 33/06; H01L 2251/558; H01L 27/3244; H01L 51/5028;
(Continued)

(56) References Cited

U.S. PATENT DOCUMENTS 8,486,543 B2   7/2013   Seo et al.
9,385,194 B2   7/2016   Cho et al.
(Continued)

FOREIGN PATENT DOCUMENTS

JP   2010209141 A   9/2010
KR      1140309 B1   5/2012
(Continued)

OTHER PUBLICATIONS

Extended European Search Report dated Oct. 7, 2019, of the corresponding European Patent Application No. 19163844.4.

*Primary Examiner* — Galina G Yushina
(74) *Attorney, Agent, or Firm* — Cantor Colburn LLP

(57) ABSTRACT

An electroluminescent device including a first electrode, a hole transport layer disposed on the first electrode, a first emission layer disposed on the hole transport layer, the first emission layer including a first light emitting particle on which a first ligand having a hole transporting property is attached, a second emission layer disposed on the first emission layer, the second emission layer including a second light emitting particle on which a second ligand having an electron transporting property is attached, an electron transport layer disposed on the second emission layer, and a second electrode disposed on the electron transport layer, wherein a solubility of the first ligand in a solvent is different than a solubility of the second ligand in the solvent and a display device including the same.

20 Claims, 8 Drawing Sheets

(51) Int. Cl.
   *H01L 51/56* (2006.01)
   *H01L 33/06* (2010.01)
   *H01L 33/08* (2010.01)
   *H01L 27/32* (2006.01)

(52) U.S. Cl.
   CPC .......... *H01L 33/08* (2013.01); *H01L 51/0007* (2013.01); *H01L 51/502* (2013.01); *H01L 51/5056* (2013.01); *H01L 51/5072* (2013.01); *H01L 51/56* (2013.01); *H01L 2251/558* (2013.01)

(58) Field of Classification Search
   CPC ............ H01L 51/0007; H01L 51/5056; H01L 51/5072; H01L 51/56; H01L 51/502; H01L 51/504
   See application file for complete search history.

(56) References Cited

U.S. PATENT DOCUMENTS

| | | | |
|---|---|---|---|
| 9,517,936 B2 | 12/2016 | Jeong et al. | |
| 9,658,475 B2 | 5/2017 | Kim et al. | |
| 9,698,354 B2 | 7/2017 | Seo et al. | |
| 9,874,675 B2 | 1/2018 | Cho et al. | |
| 2004/0166367 A1* | 8/2004 | Itoh | C08G 61/126 428/690 |
| 2005/0001538 A1* | 1/2005 | Ozkan | H01L 51/5036 313/503 |
| 2006/0263636 A1* | 11/2006 | Ohsawa | H01L 51/0072 428/690 |
| 2007/0096638 A1* | 5/2007 | Boerner | H05B 33/14 313/504 |
| 2013/0052462 A1* | 2/2013 | Ichinose | B01J 20/28023 428/398 |
| 2013/0225858 A1* | 8/2013 | Goto | C09B 57/008 560/196 |
| 2014/0228220 A1* | 8/2014 | Mukai | A01N 43/08 504/294 |
| 2017/0102586 A1 | 4/2017 | Kim et al. | |
| 2017/0278894 A1* | 9/2017 | Sato | H01L 51/502 |
| 2017/0294617 A1 | 10/2017 | Seo et al. | |
| 2018/0190908 A1* | 7/2018 | Ke | H01L 51/0018 |

FOREIGN PATENT DOCUMENTS

| | | |
|---|---|---|
| KR | 20130009024 A | 1/2013 |
| KR | 20130013810 A | 2/2013 |
| KR | 20130015671 A | 2/2013 |
| KR | 20130042372 A | 4/2013 |
| KR | 20130047943 A | 5/2013 |
| KR | 1480475 B1 | 1/2015 |
| KR | 20150092796 A | 8/2015 |
| KR | 20160090453 A | 8/2016 |
| KR | 20160095999 A | 8/2016 |
| KR | 1695442 B1 | 1/2017 |
| KR | 20170078583 A | 7/2017 |

\* cited by examiner

ELECTROLUMINESCENT DEVICE, AND DISPLAY DEVICE COMPRISING THEREOF

CROSS-REFERENCE TO RELATED APPLICATION

This application claims priority to and the benefit of Korean Patent Application No. 10-2018-0031566 filed in the Korean Intellectual Property Office on Mar. 19, 2018, and Korean Patent Application No. 10-2019-0030273 filed in the Korean Intellectual Property Office on Mar. 18, 2019, and all the benefits accruing therefrom under 35 U.S.C. § 119, the entire contents of which are incorporated herein by reference.

BACKGROUND

1. Field

An electroluminescent device and a display device including the same are disclosed.

2. Description of the Related Art

Quantum dots are a nanocrystal semiconductor material having a diameter of less than or equal to several to several hundreds of nanometers (nm), which exhibits quantum confinement effects. Quantum dots generate stronger, e.g., brighter, light in a narrow wavelength region than phosphors. Quantum dots emit light while the excited electrons are transitioned from a conduction band to a valance band and wavelengths are changed depending upon a particle size even in the same material. As quantum dots emit light of a shorter wavelength with smaller, e.g., decreasing, particle sizes, quantum dots may provide light in a desirable wavelength region by adjusting the sizes.

An emission layer including quantum dots and various types of electronic devices including the same may provide decreased production costs, compared with an organic light emitting diode using an emission layer including a phosphorescent material, fluorescent material, or a combination thereof, and desirable colors may be emitted by changing sizes of quantum dots, without using other organic materials in the emission layer for emitting other color lights.

Luminous efficiency of the emission layer including quantum dots is determined by quantum efficiency, e.g., external quantum efficiency (EQE), of quantum dots, a balance of charge carriers, light extraction efficiency, and the like. For example, in order to improve the quantum efficiency, excitons may be confined in the emission layer, but when the excitons are not confined in the emission layer, for example, due to, a variety of factors, a problem such as exciton quenching may be caused.

SUMMARY

An electroluminescent device having improved life-span characteristics and color purity simultaneously by minimizing exciton quenching and a display device including the same are provided.

According to an embodiment, an electroluminescent device includes a first electrode; a hole transport layer disposed on the first electrode; a first emission layer disposed on the hole transport layer, the first emission layer including a first light emitting particle on which a first ligand having a hole transporting property is attached; a second emission layer disposed on the first emission layer, the second emission layer including a second light emitting particle on which a second ligand having an electron transporting property is attached; an electron transport layer disposed on the second emission layer; and a second electrode disposed on the electron transport layer, wherein a solubility of the first ligand in a solvent is different than a solubility of the second ligand in the solvent.

A hole mobility of the first emission layer may be faster than a hole mobility of the second emission layer.

An electron mobility of the second emission layer may be faster than an electron mobility of the first emission layer.

When the first ligand is soluble in a hydrophilic solvent, the second ligand may be soluble in a hydrophobic solvent. When the first ligand is soluble in a hydrophobic solvent, the second ligand may be soluble in a hydrophilic solvent.

The hydrophilic solvent may include methanol, ethanol, isopropyl alcohol, acetone, butanol, dimethyl formamide, dimethyl sulfoxide, water, acetonitrile, or a combination thereof.

The hydrophobic solvent may include octane, heptane, nonane, hexane, xylene, toluene, chlorobenzene, chloroform, cyclohexane, or a combination thereof.

The first ligand and the second ligand may independently be a ligand compound derived from a thiol-based compound, a halide-based compound, an alkyl-based compound, an amine-based compound, a carbazole-based compound, a mercapto-based compound, or a combination thereof.

At least one of the first light emitting particle or the second light emitting particle may have a core-shell structure.

The first light emitting particle and the second light emitting particle may independently a Group II-VI compound that does not include Cd, a Group III-V compound, a Group IV-VI compound, a Group IV element or compound, a Group compound, a Group I-II-IV-VI compound that does not include Cd, or a combination thereof.

The first emission layer and the second emission layer may emit first light belonging to a predetermined wavelength region.

The first light may belong to a first wavelength region of about 380 nanometers (nm) to about 488 nm, a second wavelength region of about 490 nm to 510 nm, a third wavelength region of greater than 510 nm to about 580 nm, a fourth wavelength region of about 582 nm to about 600 nm, or a fifth wavelength region of about 620 nm to about 680 nm.

Each of the first emission layer and the second emission layer may have a thickness of about 10 nm to about 100 nm.

The second emission layer may be disposed directly on the first emission layer.

According to an embodiment, an electroluminescent device includes a first electrode; a hole transport layer disposed on the first electrode; a first emission layer disposed on the hole transport layer, the first emission layer and including a first light emitting particle on which a first ligand having a hole transporting property is attached; a second emission layer disposed on the first emission layer, the second emission layer and including a second light emitting particle on which a second ligand having an electron transporting property is attached; a third emission layer disposed between the first emission layer and the second emission layer, the third emission layer including third light emitting particle on which a third ligand having electrical insulating properties is attached; an electron transport layer disposed on the second emission layer; and a second electrode disposed on the electron transport layer, wherein a solubility of the third ligand in a solvent is different than a solubility of the first ligand in the solvent and different than a solubility of the second ligand in the solvent.

The third emission layer may be disposed directly on the first emission layer and the second emission layer may be disposed directly on the third emission layer.

A hole mobility of the third emission layer may be lower than a hole mobility of the first emission layer.

An electron mobility of the third emission layer may be lower than an electron mobility of the second emission layer.

A charge mobility of the third ligand may be about $10^{-10}$ square centimeters per volt-second ($cm^2/Vs$) to about $10^{-4}$ $cm^2/Vs$.

When the third ligand is soluble in a hydrophilic solvent, each of the first ligand and the second ligand may be soluble in a hydrophobic solvent. When the third ligand is soluble in for a hydrophobic solvent, each of the first ligand and the second ligand may be soluble in a hydrophilic solvent.

The third ligand may include a ligand compound derived from a thiol-based compound, a halide-based compound, an alkyl-based compound, an amine-based compound, a carbazole-based compound, a mercapto-based compound, or a combination thereof.

The first emission layer, the second emission layer, and the third emission layer may emit a first light belonging to a predetermined wavelength region.

The third emission layer may have a thickness of about 0.1 nm to about 100 nm.

A display device includes the electroluminescent device according to an embodiment.

Excitons may be effectively confined to the emission layer, and exciton quenching may be minimized and an electroluminescent device with improved life-span characteristics and color purity may be provided.

Further, a display device including an electroluminescent device with improved life-span characteristics and color purity may be provided as described above.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
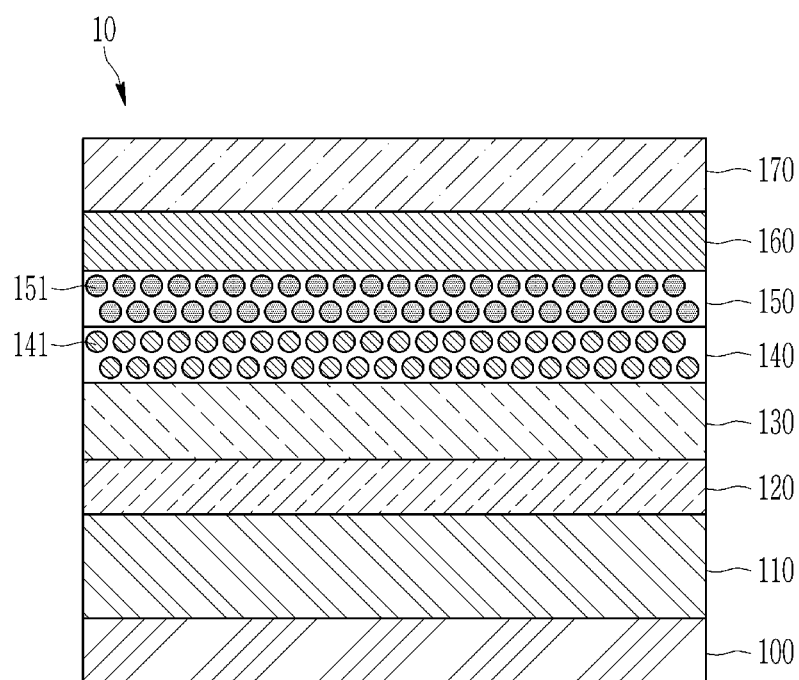
FIG. 1 is a cross-sectional view schematically showing an electroluminescent device according to an embodiment.

Example embodiments of the present disclosure will hereinafter be described in detail, and may be performed by a person having an ordinary skill in the related art. However, this disclosure may be embodied in many different forms, and is not to be construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" and "upper," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, "alkyl" may refer to a linear or branched saturated monovalent hydrocarbon group (methyl, ethyl hexyl, etc.).

As used herein, "alkenyl" may refer to a linear or branched monovalent hydrocarbon group having one or more carbon-carbon double bond.

As used herein, "alkynyl" may refer to a linear or branched monovalent hydrocarbon group having one or more carbon-carbon triple bond.

As used herein, an "amine" may have the general formula NRR, wherein each R is independently hydrogen, a C1-C30 alkyl group, a C3-C8 cycloalkyl group a C2-C30 alkenyl group, a C2-C30 alkynyl group, or a C6-C30 aryl group, each of which may be substituted or unsubstituted.

As used herein, "aryl" may refer to a group formed by removal of at least one hydrogen from an aromatic group (e.g., a phenyl or naphthyl group).

As used herein, "hetero" may refer to one including one or more (e.g., 1 to 3) heteroatom of N, O, S, Si, P, or a combination thereof.

As used herein, "Group" may refer to a group of the Periodic Table.

As used herein, "Group II" may refer to Group IIA and Group IIB, and examples of Group II metal may be Cd, Zn, Hg, and Mg, but are not limited thereto.

As used herein, examples of "Group II metal that does not include Cd" may refer to a Group II metal except Cd, for example, Zn, Hg, Mg, etc.

As used herein, "Group III" may refer to Group IIIA and Group IIIB, and examples of Group III metal may be Al, In, Ga, and Tl, but are not limited thereto.

As used herein, "Group IV" may refer to Group IVA and Group IVB, and examples of a Group IV metal may be Si, Ge, and Sn, but are not limited thereto. As used herein, the term "metal" may include a semi-metal such as Si.

As used herein, "Group I" may refer to Group IA and Group IB, and examples may include Li, Na, K, Rb, and Cs, but are not limited thereto.

As used herein, "Group V" may refer to Group VA, and examples may include nitrogen, phosphorus, arsenic, antimony, and bismuth, but are not limited thereto.

As used herein, "Group VI" may refer to Group VIA, and examples may include sulfur, selenium, and tellurium, but are not limited thereto.

As used herein, "halide" may refer to a compound in which one of the elements is a halogen.

As used herein, a hydrocarbon group may refer to a group including carbon and hydrogen (e.g., an alkyl, alkenyl, alkynyl, or aryl group). The hydrocarbon group may be a group having a monovalence or greater formed by removal of one or more hydrogen atoms from, alkane, alkene, alkyne, or arene. In the hydrocarbon group, at least one methylene may be replaced by an oxide moiety, a carbonyl moiety, an ester moiety, —NH—, or a combination thereof.

As used herein, "substituted" may refer to a compound or a moiety, wherein at least one of hydrogen atoms thereof is replaced by a substituent, wherein the substituent may be a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR' wherein R and R' are independently hydrogen or a C1 to C6 alkyl group), an azido group (—N$_3$), an amidino group (—C(=NH)NH$_2$)), a hydrazino group (—NHNH$_2$), a hydrazono group (=N(NH$_2$)), an aldehyde group (—O(=O)H), a carbamoyl group (—C(O)NH$_2$), a thiol group (—SH), an ester group (—O(=O)OR, wherein R is a C1 to C6 alkyl group or a C6 to C12 aryl group), a carboxyl group (—COOH) or a salt thereof (—O(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

FIG. 1 is a schematic cross-sectional view of an electroluminescent device according to an embodiment.

An electroluminescent device 10 according to an embodiment includes a first electrode 110, a hole transport layer 130 disposed on the first electrode 110, a hole injection layer 120 disposed between the first electrode 110 and the hole transport layer 130, a first emission layer 140 disposed on the hole transport layer 130 and including a first light emitting particle 141, a second emission layer 150 disposed on the first emission layer 140 and including a second light emitting particle 151, an electron transport layer 160 disposed on the second emission layer 150, and a second electrode 170 disposed on the electron transport layer 160.

The electroluminescent device 10 has a stack structure wherein the hole injection layer 120, the hole transporting layer 130, the first emission layer 140, the second emission layer 150, and the electron transporting layer 150 are disposed between the first electrode 110 and the second electrode 170 facing each other.

The electroluminescent device 10 according to an embodiment supplies a current to the first emission layer 140 and the second emission layer 150 through the first electrode 110 and the second electrode 170 and generates light by electroluminescence of the first light emitting particle 141 and the second light emitting particle 151. The electroluminescent device 10 generates light having various wavelength regions according to materials, sizes, detailed structures, etc. of the first and second light emitting particles 141 and 151 of the first and second emission layers 140 and 150.

In an embodiment, the first electrode 110 may be directly connected to a driving power source so that the first electrode 110 may function to flow, e.g., supply, a current to the first and second emission layers 140 and 150. The first electrode 110 may include a material having light transmittance in at least visible light wavelength region but is not limited thereto. The first electrode 110 may include a material having light transmittance in an infrared or ultraviolet (UV) wavelength region. For example, the first electrode 110 may be an optically transparent material.

In an embodiment, the first electrode 110 may include molybdenum oxide, tungsten oxide, vanadium oxide, rhenium oxide, niobium oxide, tantalum oxide, titanium oxide, zinc oxide, nickel oxide, copper oxide, cobalt oxide, manganese oxide, chromium oxide, indium oxide, or a combination thereof.

In an embodiment, the first electrode 110 may be disposed on the substrate 100 as shown in FIG. 1. The substrate 100 may be a transparent insulating substrate or may be made of a ductile material. The substrate 100 may include glass or a polymer material in a film having a glass transition temperature (Tg) of greater than about 150° C. For example, substrate 100 may include a COC (cycloolefin copolymer) or COP (cycloolefin polymer) based material.

In an embodiment, the substrate 100 may support the hole injection layer 120, the hole transport layer 130, the first emission layer 140, the second emission layer 150, and the electron transport layer 160 disposed between the first electrode 110 and the second electrode 170. The first electrode 110 of the electroluminescent device 10 according to an embodiment may not be disposed on the substrate 100, but the substrate 100 may be disposed on the second electrode 170 or may be omitted, as desired.

The second electrode 170 includes an optically transparent material and may function as a light-transmitting electrode to transmit light generated in the first and second emission layers 140 and 150 which will be described later. In an embodiment, the second electrode 170 may include silver (Ag), aluminum (Al), copper (Cu), gold (Au), an alloy thereof, molybdenum oxide, tungsten oxide, vanadium oxide, rhenium oxide, niobium oxide, tantalum oxide, titanium oxide, zinc oxide, nickel oxide, copper oxide, cobalt oxide, manganese oxide, chromium oxide, indium oxide, or a combination thereof.

Each of the first electrode 110 and the second electrode 170 may be formed by depositing a material for forming an electrode on the substrate 100 or an organic layer by a method such as sputtering.

The hole transport layer 130 may be disposed between the first electrode 110 and the first emission layer 140. The hole transport layer 130 serves to supply and transport the holes to the first and second emission layers 140 and 150. The hole transport layer 130 is formed directly under the first emission layer 140 to directly contact the first emission layer 140.

In an embodiment, the hole transport layer 130 may be formed of the p-type semiconductor material, or a material doped with a p-type dopant. For example, the hole transport layer 130 may include a poly (3,4-ethylenedioxythiophene) (PEDOT) derivative, a poly(styrene sulfonate) (PSS) derivative, a poly-N-vinylcarbazole (PVK) derivative, a polyphenylenevinylene derivative, a poly p-phenylene vinylene (PPV) derivative, a polymethacrylate derivative, a poly(9,9-dioctylfluorene) derivative, a poly(spiro-fluorene) derivative, N,N'-diphenyl-N,N'-bis(3-methylphenyl)-(1,1'-biphenyl)-4,4'-diamine (TPD), N,N'-di(naphthalen-1-yl)-N—N'-diphenyl-benzidine (NPB), tris(N-3-methylphenyl-N-phenylamino)-triphenylamine (m-MTDATA), poly(9,9-dioctylfluoro-co-N-(4-butylphenyl)diphenylamine) (TFB), poly(9,9-dioctylfluorene)-co-N,N-diphenyl-N,N-di-(p-butylphenyl)-1,4-diaminobenzene (PFB), poly-TPD, metal oxide such as NiO or $MoO_3$, or a combination thereof, but is not limited thereto.

The hole transport layer 130 may be formed using a wet coating method such as spin coating. For example, a polymer film such as PEDOT:PSS or TFB is formed on the first electrode 110, a precursor solution including a precursor polymer and a methanol organic solvent is spin-coated on the first electrode 110, and then thermally treated in an inert gas atmosphere, for example, $N_2$ or under vacuum at a curing temperature of about 100° C. to about 300° C. for 3 hours to manufacture the hole transport layer 130 including, e.g., composed of, a polymer thin film.

The hole injection layer 120 may be disposed between the first electrode 110 and the hole transport layer 130. The hole injection layer 120 may supply holes into the first and second emission layers 140 and 150 together with the hole transporting layer 130 and may be omitted considering the thickness and the material of the hole transporting layer 130.

The hole injection layer 120 may be formed of a p-type semiconductor material or a material doped with a p-type dopant, like the aforementioned hole transport layer 130. For example, the hole injection layer 120 may include poly (3,4-ethylenedioxythiophene) (PEDOT) derivative, a poly (styrene sulfonate) (PSS) derivative, a poly-N-vinylcarbazole (PVK) derivative, a polyphenylenevinylene derivative, a poly p-phenylene vinylene (PPV) derivative, a polymethacrylate derivative, a poly (9,9-dioctylfluorene) derivative, a poly(spiro-fluorene) derivative, N,N'-diphenyl-N,N'-bis(3-methylphenyl)-(1,1'-biphenyl)-4,4'-diamine (TPD), N,N'-di(naphthalen-1-yl)-N—N'-diphenyl-benzidine (NPB), tris(N-3-methylphenyl-N-phenylamino)-triphenylamine (m-MTDATA), poly (9,9-dioctylfluorene-co-N-(4-butylphenyl)diphenylamine) (TFB), poly(9,9-dioctylfluorene)-co-N,N-diphenyl-N,N-di-(p-butylphenyl)-1,4-diaminobenzene (PFB), poly-TPD, a metal oxide such as NiO and $MoO_3$, or a combination thereof but is not limited thereto.

The first and second emission layers 140 and 150 may include a plurality of light emitting particles. That is, the first emission layer 140 may include a plurality of first light emitting particles 141 and the second emission layer 150 may include a plurality of second light emitting particles 151.

The first and second emission layers 140 and 150 are sites where electrons and holes transported by a current supplied from the first electrode 110 and the second electrode 170. The electrons and holes are combined in the first and second emission layers 140 and 150 to generate excitons and the generated excitons are transitioned from an exited state to a ground state to emit light in wavelengths corresponding to sizes of the first and second light emitting particles 141 and 151.

The second emission layer 150 may be directly on the first emission layer 140. That is, the upper surface of the first emission layer 140 and the lower surface of the second emission layer 150 may be in contact with each other. The first emission layer 140 and the second emission layer 150 may have different electrical characteristics. According to an embodiment, the first emission layer 140 has a faster hole transport velocity than the electron transport velocity and may exhibit stronger, e.g., greater, electron transport capability, and the second emission layer 150 has a faster electron transport velocity than the hole transport velocity and may exhibit stronger, e.g., greater, hole transport capability.

For example, the hole mobility of the first emission layer 140 may be faster than the hole mobility of the second emission layer 150.

For example, the electron mobility of the second emission layer 150 may be faster than the electron mobility of the first emission layer 140.

For example, a relationship of charges (holes/electrons) mobility between the first emission layer 140 and the second emission layer 150 may satisfy at least one of the aforementioned relationships.

The first emission layer 140 transports holes toward the second emission layer 150 and the second emission layer 150 transports electrons toward the first emission layer 140 so that holes and electrons are combined on, e.g., at, the interface between the first emission layer 140 and the second emission layer 150, in the vicinity of the interface, or a combination thereof.

Figure 2:
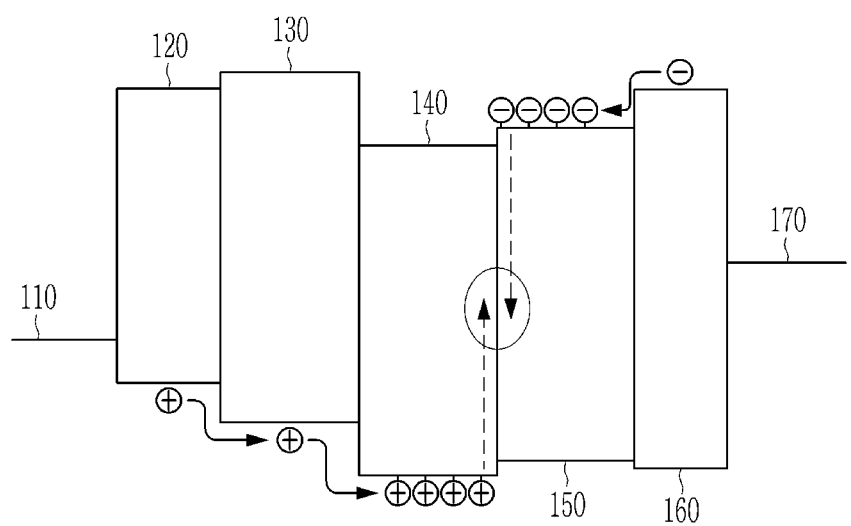
FIG. 2 is an energy band diagram of the electroluminescent device of FIG. 1.

FIG. 2 schematically shows a principle of the electroluminescent device driving according to an embodiment, and each constituent element in electroluminescent device 10 is shown by an energy band diagram.

Referring to FIG. 2, holes move from the hole injection layer 120 to the first emission layer 140 through the hole transport layer 130. The first emission layer 140 according to an embodiment may have hole transport capability, and the holes reaching the first emission layer 140 move toward the second emission layer 150. Electrons may move from the electron injection layer to the electron transport layer 160. The second emission layer 150 according to an embodiment may have electron transport capability, and the electrons move toward the first emission layer 140 even in the second emission layer 150.

The holes and the electrons in the first and second emission layers 140 and 150 are combined on, e.g., at, the interface between the first emission layer 140 and the second emission layer 150, in the vicinity of the interface, or a combination thereof, as shown in FIG. 2.

The first emission layer 140 and the second emission layer 150 may be adjusted so that excitons may be generated on, e.g., at, the interface between the first emission layer 140 and the second emission layer 150, in the vicinity of the interface, or a combination thereof using a difference in charge mobility, for example, due to different electrical characteristics.

If the first and second emission layers 140 and 150 are relatively thick, it may be relatively difficult to adjust an internal carrier balance in the electroluminescent device 10. If the first and second emission layers 140 and 150 are relatively thin, it may be relatively difficult to provide the aforementioned electron/hole transport capability.

The thickness of each of the first and second emission layers 140 and 150, in consideration of the aforementioned electron/hole transport capability and the carrier balance, may be, for example, greater than or equal to about 5 nm, greater than or equal to about 6 nm, greater than or equal to about 7 nm, greater than or equal to about 8 nm, greater than or equal to about 9 nm, or greater than or equal to about 10 nm and may be, for example, less than or equal to about 100 nm, less than or equal to about 90 nm, less than or equal to about 80 nm, less than or equal to about 70 nm, less than or equal to about 60 nm, less than or equal to about 50 nm, less than or equal to about 45 nm, less than or equal to about 40 nm, less than or equal to about 35 nm, less than or equal to about 30 nm, less than or equal to about 28 nm, less than or equal to about 26 nm, less than or equal to about 24 nm, less than or equal to about 22 nm, less than or equal to about 20 nm, less than or equal to about 18 nm, or less than or equal to about 16 nm.

In an electroluminescent device using a quantum dot as a light emitting body, hole-moving velocity may not be smooth compared with electron-moving velocity, e.g., hole-moving velocity may not be comparable to electron-moving velocity. The first emission layer 140 may have the same thickness or a greater thickness than the second emission layer 150.

An embodiment is not limited thereto, but each of the first and second emission layers 140 and 150 may have a thickness determined by considering each material, a material and a thickness of the hole transport layer 130, the electron transport layer 160, a combination thereof, and the like.

Both of the first and second emission layers 140 and 150 may emit first light belonging to a predetermined wavelength region. The first light belongs to a visible light region, for example, one of a first wavelength region of about 380 nm to about 488 nm, a second wavelength region of about 490 nm to about 510 nm, a third wavelength region of about 510 nm to about 580 nm, a fourth wavelength region of about 582 nm to about 600 nm, and a fifth wavelength region of about 620 nm to about 680 nm.

An embodiment is not limited thereto, but the first emission layer 140 and the second emission layer 150 may be set, e.g., configured to emit light at a different wavelength from each other. The electroluminescent device 10 may emit light of a mixed color of light emitted from the first emission layer 140 with light emitted from the second emission layer 150 and a further mixed color of light with different light supplied from an external light source.

In an embodiment, at least either one of the first and second light emitting particles 141 and 151 may include a quantum dot. The first and second light emitting particles 141 and 151 may be all quantum dots, or either one of the first and second light emitting particles 141 and 151 may be a quantum dot, and the other one may be a different light emitting body from the quantum dot, for example, a commercially-available phosphor and the like.

The quantum dots have a discontinuous energy bandgap by the quantum confinement effect and incident light may be converted into light having a particular wavelength and then radiated. Both of the first and second light emitting particles 141 and 151 may include, e.g., be composed of, quantum dots, and the first and second emission layers 140 and 150 may generate light having improved color reproducibility and color purity.

In an embodiment, materials of the quantum dot are not particularly limited and commercially available quantum dots may be used. For example, each of the first and second light emitting particles 141 and 151 may be a quantum dot including a Group II-VI compound that does not include Cd, a Group III-V compound, a Group IV-VI compound, a Group IV element or compound, a Group compound, a Group I-II-IV-VI compound that does not include Cd, or a combination thereof. That is, each of the first and second light emitting particles 141 and 151 according to an embodiment may be a non-cadmium-based quantum dot. The first and second light emitting particles 141 and 151 may include, e.g., consist of, non-cadmium-based materials, the first and second light emitting particles 141 and 151 may have reduced or no toxicity compared with cadmium-based quantum dots, and the first and second light emitting particles 141 and 151 may not be dangerous and may be environmentally-friendly.

The Group II-VI compound may be a binary element compound of ZnS, ZnSe, ZnTe, ZnO, HgS, HgSe, HgTe, MgSe, MgS, or a combination thereof; a ternary element compound of ZnSeS, ZnSeTe, ZnSTe, HgSeS, HgSeTe, HgSTe, HgZnS, HgZnSe, HgZnTe, MgZnSe, MgZnS, or a combination thereof; or a quaternary element compound of ZnSeSTe, HgZnTeS, HgZnSeS, HgZnSeTe, HgZnSTe, or a combination thereof. The Group II-VI compound may further include a Group III metal.

The Group III-V compound may be a binary element compound of GaN, GaP, GaAs, GaSb, AlN, AlP, AlAs, AlSb, InN, InP, InAs, InSb, or a combination thereof; a ternary element compound of GaNP, GaNAs, GaNSb, GaPAs, GaPSb, AlNP, AlNAs, AlNSb, AlPAs, AlPSb, InNP, InNAs, InNSb, InPAs, InPSb, InZnP, or a combination thereof; or a quaternary element compound of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof. The Group III-V compound may further include a Group II metal (InZnP).

The Group IV-VI compound may be a binary element compound of SnS, SnSe, SnTe, PbS, PbSe, PbTe, or a combination thereof; a ternary element compound of SnSeS, SnSeTe, SnSTe, PbSeS, PbSeTe, PbSTe, SnPbS, SnPbSe, SnPbTe, or a combination thereof; or a quaternary element compound of SnPbSSe, SnPbSeTe, SnPbSTe, or a combination thereof. Examples of the Group compound may be $CuInSe_2$, $CuInS_2$, CuInGaSe, and CuInGaS, are not limited thereto. Examples of the Group I-II-IV-VI compound may be CuZnSnSe and CuZnSnS, are not limited thereto. Examples of the Group IV compound may be a single substance of Si, Ge, or a combination thereof; or a binary element compound of SiC, SiGe, or a combination thereof.

The binary element compound, the ternary element compound, or the quaternary element compound respectively exists in a uniform concentration in the particle or in partially different concentrations in the same particle.

According to an embodiment, the quantum dots may have a core-shell structure including one semiconductor nanocrystal core and another semiconductor nanocrystal shell surrounding the core. The core and the shell may have a concentration gradient wherein the concentration of the element(s) of the shell decreases toward the core. The quantum dots may have one semiconductor nanocrystal core and multi-shells surrounding the core. The multi-layered shell structure may have a structure of, e.g., including, two or more shells and each layer may have a single composition or an alloy or may have a concentration gradient.

In an embodiment, at least one of the first light emitting particle or the second light emitting particle may have a core-shell structure. When at least one of the first and second light emitting particles has a core-shell structure, a material composition of the shell has a larger energy bandgap than an energy bandgap of the core, which may exhibit an effective quantum confinement effect. An embodiment is not limited thereto. In the multi-layered shell, a shell that is outside of the core has may have a larger energy bandgap than a shell that is near, e.g., closer or adjacent, to the core and quantum dots may have an ultraviolet (UV) to infrared wavelength ranges.

The quantum dots may have quantum efficiency of greater than or equal to about 10%, for example, greater than or equal to about 20%, greater than or equal to about 30%, greater than or equal to about 40%, greater than or equal to about 50%, greater than or equal to about 60%, greater than or equal to about 70%, greater than or equal to about 90%, or even 100%.

In a display, the quantum dots may have a relatively narrow spectrum so as to improve color purity or color reproducibility. The quantum dots may have, for example, a full width at half maximum (FWHM) of a photoluminescence wavelength spectrum of less than or equal to about 45 nm, less than or equal to about 40 nm, or less than or equal to or about 30 nm. Within the ranges, color purity or color reproducibility of a device may be improved.

The quantum dots may have a particle diameter (the longest diameter for a non-spherically shaped particle) of about 1 nm to about 100 nm. For example, the quantum dots may have a particle diameter of about 1 nm to about 20 nm, for example, about 2 nm (or about 3 nm) to about 15 nm.

The shapes of the quantum dots may be any suitable shape and may not be particularly limited. For example, the quantum dots may have a spherical, oval, cubic, tetrahedral, pyramidal, cuboctahedral, cylindrical, polyhedral, or multi-armed nanoparticle, nanotube, nanowire, nanofiber, nanosheet, or a combination thereof. The quantum dots may have any suitable cross-sectional shape.

The quantum dots may be commercially available or may be synthesized in any suitable method. For example, several nano-sized quantum dots may be synthesized according to a wet chemical process. In the wet chemical process, precursor materials react in an organic solvent to grow crystal particles.

According to an embodiment, a first ligand is attached to the surface of the first light emitting particle 141 and a second ligand is attached to the second light emitting particle 151, respectively.

In an embodiment, the first ligand and the second ligand may have different electrical characteristics. According to an embodiment, the first ligand has faster hole transport velocity than electron transport velocity and may exhibit strong electron transport capability, and the second ligand has faster electron transport velocity than hole transport velocity and may exhibit strong hole transport capability. The first emission layer 140 may have stronger, e.g., greater, hole transport capability than the second ligand, for example, due to electrical characteristics of the first ligand, and the second emission layer 150 may have stronger, e.g., greater, electron transport capability than the first ligand, for example, due to electrical characteristics of the second ligand.

An electroluminescent device using a quantum dot as a light-emitting body may not have smooth hole-moving velocity relative to the electron-moving velocity, e.g., the hole-moving velocity may not be comparable to the electron-moving velocity, as described above, and a place where electrons and holes are combined with each other may be shifted toward an interface between an emission layer and an electron transport layer.

In this way, the place where electrons and holes are combined with each other may be shifted toward an interface between an emission layer and an electron transport layer, and excitons generated on, e.g., at, the interface may not be confined inside the emission layer but quenched on, e.g., an interface with a common layer. Extra electrons not combined with holes on, e.g., at, the interface may move toward the hole transport layer and form excitons in the hole transport layer. According, the exciton quenching and extra electron loss may significantly deteriorate device efficiency.

As for the electroluminescent device 10 according to an embodiment, the first emission layer 140 may be disposed to closely, e.g., directly, contact the second emission layer 150, and the first emission layer 140 may have hole transport capability, for example, due to the first ligand, and the second emission layer 150 may have electron transport capability, for example, due to the second ligand.

The first emission layer 140 may transport holes from the hole transport layer 130 toward the second emission layer 150 relatively easily, and the second emission layer 150 may easily transport electrons from the electron transport layer 160 toward the first emission layer 140 relatively easily. As a result, as shown in FIG. 2, the place where electrons and holes are combined inside the first and second emission layers 140 and 150 may be relatively easy to adjust.

The first and second ligands may be respectively attached on each surface of the first and second light emitting particles 141 and 151 by using a surfactant for attaching the first and second ligands. The first and second ligands may be attached on, e.g., to the surface of the first and second light emitting particles 141 and 151 by putting the surfactants for attaching the first and second ligands along with a precursor material for forming a quantum dot and an organic solvent or putting the surfactants for attaching first and second ligands into a mixed solution of a completely-formed quantum dot and an organic solvent.

The first and second ligands according to an embodiment may be coordinated on, e.g., bound to, the surface of the first and second light emitting particles 141 and 151. The quantum dot may have a core-shell structure, and the first and second ligands may be coordinated on, e.g., bound to, the surface exposed at an outside of the shell.

A remaining organic solvent may be further coordinated on, e.g., bound to, the surface of the quantum dot in addition to the first and second ligands. The organic solvent coordinated on, e.g., bound to, the surface of the quantum dot may affect stability of a device, and excess organic materials that are not coordinated on, e.g., bound to, the surface of the nanocrystals may be removed by pouring the organic solvent in excess non-solvent, and centrifuging the resulting mixture. The non-solvent may be commercially available various materials. After removing the excess organic solvent, an amount of the materials coordinated on, e.g., bound to, the surface of the quantum dot may be less than or equal to about 50 weight percent (wt %), for example, less than or equal to about 30 wt %, less than or equal to about 20 wt %, or less than or equal to about 10 wt % based on the weight of the quantum dot.

In an embodiment, the first ligand and the second ligand may have a different solvent selectivity. In particular, with respect to a given solvent, the first ligand may have a solubility different than the second ligand. The first ligand may have solubility for, e.g., may be soluble in, a hydrophilic solvent, and the second ligand may have solubility for, e.g., may be soluble in, a hydrophobic solvent. The first ligand may have solubility for, e.g., may be soluble in, a hydrophobic solvent, and the second ligand may have solubility for, e.g., may be soluble in, a hydrophilic solvent.

Examples of the hydrophilic solvent may be methanol, ethanol, isopropyl alcohol, acetone, butanol, dimethyl formamide, dimethyl sulfoxide, water, acetonitrile, or a combination thereof.

Examples of the hydrophobic solvent may be octane, heptane, nonane, hexane, xylene, toluene, chlorobenzene, chloroform, cyclohexane, or a combination thereof.

The first ligand and the second ligand may independently include a ligand compound derived from a thiol-based compound, a halide-based compound, an alkyl-based compound, an amine-based compound, a carbazole-based compound, a mercapto-based compound, or a combination thereof and may be respectively chosen with consideration to solvent selectivity thereof.

In this way, the first ligand and the second ligand may have different solvent selectivity, and a composition for forming a first emission layer including first light emitting particles and a composition for forming a second emission layer including second light emitting particles may not be mixed with each other in a liquid state but respectively formed into separate layers.

The first and second emission layers may be formed by not respectively coating and curing the compositions for first and second emission layers but coating the composition for a first emission layer and the composition for a second emission layer directly thereon and then, curing them at once (so-called, a solution process) to rapidly form first and second emission layers.

The compositions for first and second emission layers may have different solvent selectivity each other, and an interface between the first emission layer 140 and the second emission layer 150 may not be damaged by a solvent but may have a uniform surface morphology during formation of the first and second emission layers 140 and 150. Luminous efficiency and reliability of the first and second emission layers 140 and 150 may be improved.

In an embodiment, the electron transport layer 160 is disposed between the second emission layer 150 and the second electrode 170 and transports electrons into the first and second emission layers 140 and 150. The electron transport layer may include an inorganic oxide nanoparticle or may be an organic layer formed by deposition. The electron transport layer may be formed of an n-type semiconductor material or a material doped with an n-type dopant.

In an embodiment, an electron injection layer facilitating injection of electrons may be further disposed between the electron transport layer 160 and the second electrode 170. In an embodiment, a hole blocking layer blocking movement of holes may be further disposed between the second electrode 170 and the second emission layer 150.

Each thickness of the electron transport layer 160, the electron injection layer, and the hole blocking layer may be desirably selected. For example, a thickness of each layer may be in a range of greater than or equal to about 1 nm and less than or equal to about 500 nm but is not limited thereto. The electron injection layer may be an organic layer formed by deposition, and may be omitted considering a thickness or a material of the electron transport layer 160.

The electron injection layer, the electron transport layer 160, or a combination thereof may include, for example 1,4,5,8-naphthalene-tetracarboxylic dianhydride (NTCDA), bathocuproine (BCP), tris[3-(3-pyridyl)-mesityl] borane (3TPYMB), LiF, $Alq_3$, $Gaq_3$, $Inq_3$, $Znq_2$, $Zn(BTZ)_2$, $BeBq_2$, (8-(4-(4,6-di(naphthalen-2-yl)-1,3,5-triazin-2-yl)phenyl) quinolone), 8-hydroxyquinolinato lithium (Liq), n-type metal oxide (e.g., ZnO, ZnMgO, $HfO_2$, etc.), bathophenanthroline (Bphen), a pyrazole-based compound, a phosphonyl phenol-based compound, compounds represented by Chemical Formula 1 to Chemical Formula 4, or a combination thereof, but are not limited thereto.

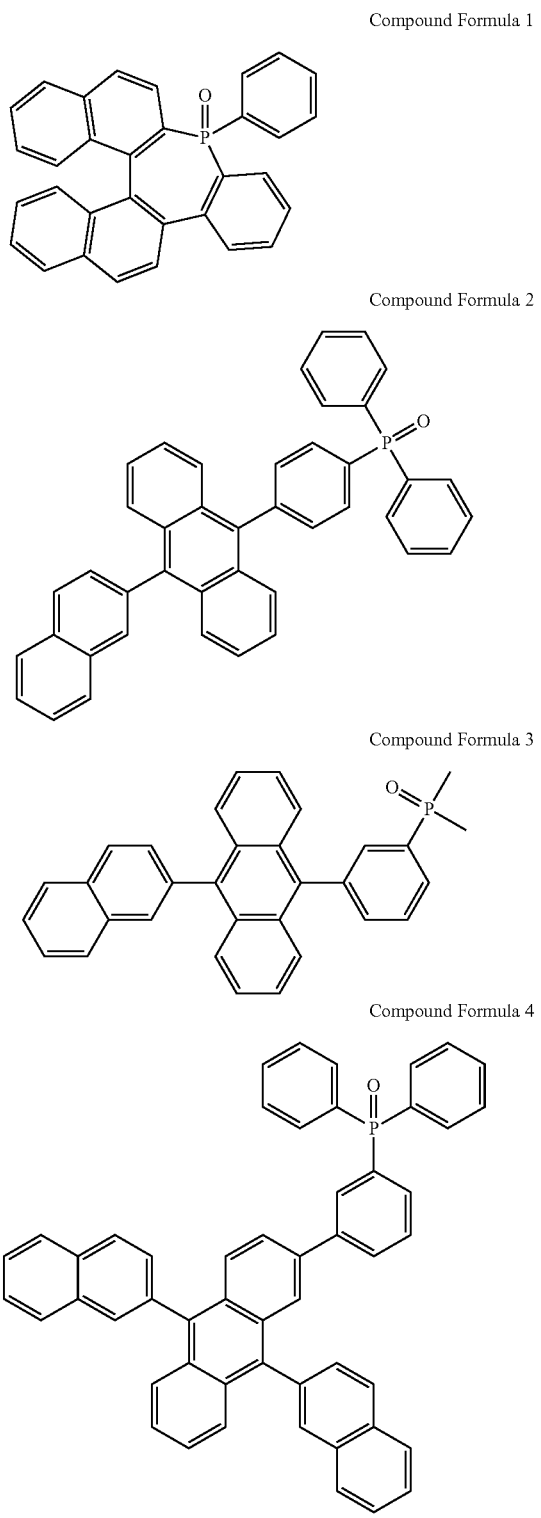

Compound Formula 1

Compound Formula 2

Compound Formula 3

Compound Formula 4

The hole blocking layer may include, for example, 1,4,5,8-naphthalene-tetracarboxylic dianhydride (NTCDA), bathocuproine (BCP), tris[3-(3-pyridyl)-mesityl] borane (3TPYMB), LiF, $Alq_3$, $Gaq_3$, $Inq_3$, $Znq_2$, $Zn(BTZ)_2$, $BeBq_2$, or a combination thereof, but is not limited thereto. The hole blocking layer may be omitted considering a thickness, a material, and the like of other constituent elements in the electroluminescent device 10.

As described above, in the electroluminescent device 10 according to an embodiment, the other constituent elements except for, e.g., other than, the first and second emission layers 140 and 150 may be formed by a method such as deposition. Thereby, it may be relatively easy to form the other constituent elements except for, e.g., other than, the first and second emission layers 140 and 150 as a common layer during forming a display device.

As described above, as for the electroluminescent device 10 according to an embodiment, the first and second emission layers 140 and 150 respectively may have hole transport capability and electron transport capability, for example, due to the first and second ligands. Holes and electrons may be combined on, e.g., at, an interface between the first and second emission layers 140 and 150, in the vicinity of the interface, or a combination thereof, and excitons may be confined inside the emission layers relatively easily.

The first and second ligands may have different solvent selectivity, and as for the electroluminescent device 10 according to an embodiment, the first and second emission layers 140 and 150 may be formed relatively easily through a solution process, and the interface between the first and second emission layers 140 and 150 may have uniform surface morphology.

The electroluminescent device 10 according to an embodiment may minimize exciton quenching by adjusting a place where excitons are generated on, e.g., at, the interface between the first and second emission layers, in the vicinity of the interface, or a combination thereof and emit light having relatively high purity and have improved lifespan characteristics.

Hereinafter, referring to FIGS. 3 to 4, a schematic structure and a driving principle of an electroluminescent device according to an embodiment are described.

Figure 3:
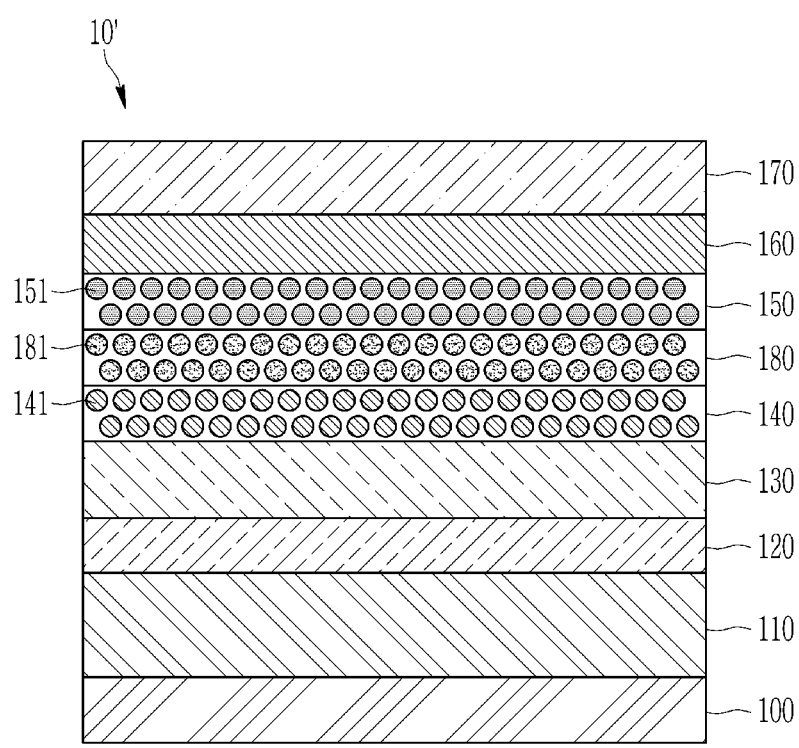
FIG. 3 is a cross-sectional view schematically showing an electroluminescent device according to an embodiment.
Figure 4:
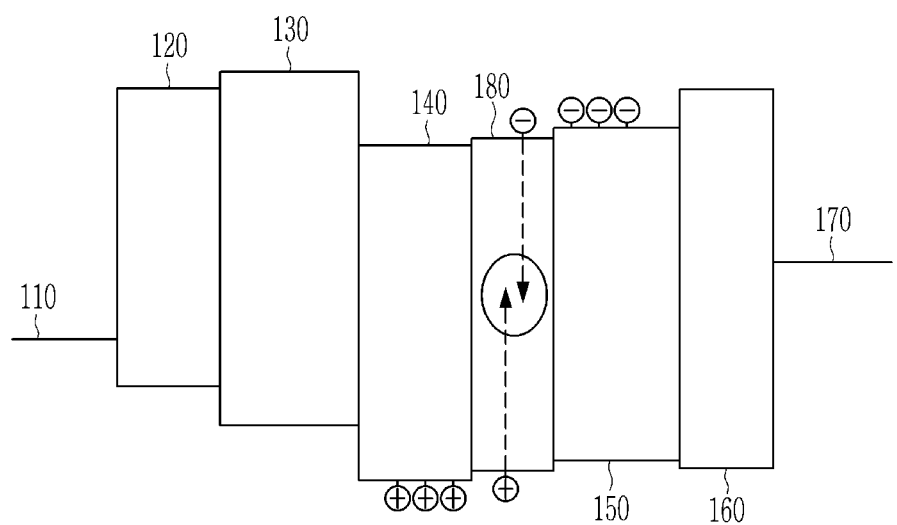
FIG. 4 is an energy band diagram of the electroluminescent device of FIG. 3.

FIG. 3 is a cross-sectional view schematically showing an electroluminescent device according to an embodiment and FIG. 4 schematically shows a driving principle of an electroluminescent device according to an embodiment. An electroluminescent device 10' according to an embodiment, may have the same structure as that of the aforementioned electroluminescent device 10 according to an embodiment and is not described in detail.

Referring to FIG. 3, the electroluminescent device 10' according to an embodiment may further include a third emission layer 180 between the first emission layer 140 and the second emission layer 150 unlike the electroluminescent device 10 according to an embodiment.

The third emission layer 180 is disposed directly on the first emission layer 140, the second emission layer 150 is disposed directly on the third emission layer 180, and the first emission layer 140, the third emission layer 180, and the second emission layer 150 may form a sequentially stacked structure.

The first, second, and third emission layers 140, 150, and 180 may all emit first light belonging to a predetermined wavelength region but is not limited thereto, but the first emission layer 140, the second emission layer 150, the third emission layer 180, or a combination thereof may be set, e.g., configured, to emit different light, e.g., different colored light, from one another. The electroluminescent device 10 may emit a mixed color of light respectively emitted from the first, second, and third emission layers 140, 150, and 180 or a more mixed color of the light with light supplied from an external light source.

The third emission layer 180 may have different electrical characteristics from the electrical characteristics of each of the first and second emission layers 140 and 150. The third emission layer 180 may have an internal electron mobility and hole mobility this is less than or equal to an internal electron mobility and hole mobility of each of the first and second emission layers 140 and 150.

In the electroluminescent device 10' according to an embodiment, the third emission layer 180 may have slower hole mobility than a hole mobility of the first emission layer 140.

In an embodiment, the third emission layer 180 may have slower hole mobility than a hole mobility of the second emission layer 150. The hole mobility relationship between the third emission layer 180 and the second emission layer 150 is not necessarily limited thereto, but the third emission layer 180 and the second emission layer 150 may have the same hole mobility, or the third emission layer 180 may have faster hole mobility than a hole mobility of the second emission layer 150.

In the electroluminescent device 10' according to an embodiment, the third emission layer 180 may have slower electron mobility than an electron mobility of the second emission layer 150.

In an embodiment, the third emission layer 180 may have slower electron mobility than an electron mobility of the first emission layer 140. The electron mobility between the third emission layer 180 and the first emission layer 140 is not limited thereto, but the third emission layer 180 may have the same electron mobility as that of the first emission layer 140 or slower electron mobility than an electron mobility of the first emission layer 140.

In this way, a place where electrons and holes are combined in the electroluminescent device 10' according to an embodiment may be on, e.g., at, the interface between the first emission layer 140 and the third emission layer 180, on, e.g., at, the interface between the third emission layer 180 and the second emission layer 150, in the vicinity of the interfaces in the third emission layer 180, or a combination thereof by adjusting charge (hole/electron) mobility of the first, second, and third emission layers 140, 150, and 180, as shown in FIG. 4.

The electroluminescent device 10' according to an embodiment may improve optical confinement about, e.g., around, a carrier and an exciton and exhibit improved light emitting characteristics.

A thickness of the third emission layer 180 considering the aforementioned electron/hole transport capability and the carrier balance may be, for example, greater than or equal to about 5 nm, greater than or equal to about 6 nm, greater than or equal to about 7 nm, greater than or equal to about 8 nm, greater than or equal to about 9 nm, or greater than or equal to about 10 nm and, for example, less than or equal to about 100 nm, less than or equal to about 90 nm, less than or equal to about 80 nm, less than or equal to about 70 nm, less than or equal to about 60 nm, less than or equal to about 50 nm, less than or equal to about 45 nm, less than or equal to about 40 nm, less than or equal to about 35 nm, less than or equal to about 30 nm, less than or equal to about 28 nm, less than or equal to about 26 nm, less than or equal to about 24 nm, less than or equal to about 22 nm, less than or equal to about 20 nm, less than or equal to about 18 nm, or less than or equal to about 16 nm, for example, 0.1 nm to 100 nm.

The third emission layer 180 includes a third light emitting particle 181. The third light emitting particle 181 may be a quantum dot like the aforementioned first and second light emitting particles 141 and 151 and have a core-shell structure.

The third light emitting particle 181 may have a third ligand having different electrical properties to the first and second light emitting layers 140 and 150. In one embodiment, the third ligand exhibits relatively lower charge (hole/electron) transporting properties than the first and second ligands. The third ligand is attached on the surface of the third light emitting particle 181. The third emission layer 180 exhibits relatively lower charge (hole/electron) transporting properties than the first and second light emitting layers 140 and 150 due to the third ligand.

The third ligand may have, for example, charge (hole/electron) mobility of greater than or equal to about $10^{-10}$ cm$^2$/Vs, greater than or equal to about $10^{-9}$ cm$^2$/Vs, or greater than or equal to about $10^{-8}$ cm$^2$/Vs and, for example, less than or equal to about $10^{-4}$ cmWs, less than or equal to about $10^{-5}$ cm$^2$/Vs, or less than or equal to about $10^{-6}$ cm$^2$/Vs.

In the electroluminescent device 10' according to an embodiment, the third ligand has different solvent selectivity from the first and second ligands. The third ligand may have solubility for, e.g., be soluble in, a hydrophilic solvent, and both of the first and second ligands may have solubility for, e.g., be soluble in, a hydrophobic solvent. The third ligand may have solubility for, e.g., be soluble in, a hydrophobic solvent, and both of the first and second ligands may have solubility for, e.g., be soluble in, a hydrophilic solvent.

The third ligand includes a thiol derivative, a halide derivative, an alkyl derivative, an amine derivative, a carbazole derivative, or a combination thereof, like the aforementioned first and second ligands and may be chosen by considering different solvent selectivity from the aforementioned first and second ligands.

In this way, the third ligand may have different solvent selectivity from the first and second ligands, and a composition for a first emission layer including first light emitting particles and a composition for a second emission layer including second light emitting particles may not be mixed with a composition for a third emission layer including third light emitting particles in a liquid state and may form a separate layer therefrom.

Like the electroluminescent device 10 according to an embodiment, a multi-emission layer may be formed relatively easily through a solution process of sequentially coating each composition for first, second, and third emission layer and curing them at one time.

The compositions for first and second emission layers may have different solvent selectivity from the composition for a third emission layer, and an interface between the third emission layer 180 and the first emission layer 140 and an interface between the third emission layer 180 and the second emission layer 150 may not be respectively damaged by a solvent but may have a uniform surface morphology. Luminous efficiency and reliability of the first, second, and third emission layers 140, 150, and 180 may be improved.

As described above, the electroluminescent device 10' according to an embodiment may have the first, second, and third emission layers 140, 150, and 180, respectively having charge (hole/electron) mobility, for example, due to the first, second, and third ligands having different electrical characteristics. Holes and electrons may be combined with each other on, e.g., at, the interfaces between the first emission layer 140 and the third emission layer 180 and between the third emission layer 180 and the second emission layer 150, in the vicinity of the interfaces inside the third emission layer 180, or a combination thereof, and excitons may be confined relatively easily inside the emission layer.

As the first, second, and third ligands have different solvent selectivity, the first, second, and third emission layers 140, 150, and 180 may be formed relatively easily by using a solution process in the electroluminescent device 10 according to an embodiment, and the interfaces between the first, second, and third emission layers 140, 150, and 180 may also have uniform surface morphology.

Furthermore, the aforementioned electroluminescent device 10' according to an embodiment may minimize exciton quenching and emit light having relatively high color purity and improved life-span characteristics like the aforementioned electroluminescent device 10 according to the above embodiment.

Hereinafter, a display device including the aforementioned electroluminescent device 10 is described.

A display device according to an embodiment includes a substrate, a driving circuit formed on the substrate, and a first electroluminescent device, a second electroluminescent device, and a third electroluminescent device spaced apart from each other in a predetermined interval and disposed on the driving circuit.

The first to third electroluminescent devices may have the same structure as the aforementioned electroluminescent device 10, but the wavelengths of the lights emitted from each of the quantum dots may be different from each other.

In an embodiment, the first electroluminescent device is a red device emitting red light, the second electroluminescent device is a green device emitting green light, and the third electroluminescent device is a blue device emitting blue light. The first to third electroluminescent devices may be pixels expressing, e.g., emitting, red light, green light, and blue light, respectively, in the display device.

An embodiment is not necessarily limited thereto, but the first to third electroluminescent devices may respectively express, e.g., emit, magenta light, yellow light, cyan light, or may express, e.g., emit, other colors, e.g., other colored light.

One of the first to third electroluminescent devices may be the aforementioned electroluminescent device 10. In this case, the third electroluminescent device displaying at least blue light may be desirably the aforementioned electroluminescent device 10.

In the display device according to an embodiment, a hole injection layer, a hole transporting layer, an electron transporting layer, an electron injection layer, and a hole blocking layer except an emission layer of each pixel may be integrated to form a common layer. An embodiment is not limited thereto. A hole injection layer, a hole transporting layer, an electron transporting layer, an electron injection layer, and a hole blocking layer may be independently formed in each pixel of the display device, or a hole injection layer, a hole transporting layer, an electron transporting layer, an electron injection layer, a hole blocking layer, or a combination thereof may form a common layer and remaining layers may form a separate independent layer.

The substrate may be a transparent insulating substrate or may be made of a ductile material. The substrate may include glass or a polymer material in a film having a glass transition temperature (Tg) of greater than about 150° C. For example, the substrate may include a COC (cycloolefin copolymer) or COP (cycloolefin polymer) based material. All the aforementioned first to third electroluminescent devices are formed on the substrate. That is, a substrate of the display device according to an embodiment provides a common layer.

The driving circuit is disposed on the substrate and is independently connected to each of the first to third electroluminescent devices. The driving circuit may include a scan line, a data line, a driving power source line, a common power source line, and the like, or a combination thereof, at least two of thin film transistors (TFT) connected to the wire and corresponding to one organic light emitting diode, and at least one capacitor, or the like. The driving circuit may have a variety of suitable structures.

As described above, a display device according to an embodiment may display images having improved color purity and color reproducibility without separate light source such as a backlight unit. The display device according to an embodiment may minimize the exciton quenching phenomenon of each device, and may exhibit improved color purity and life-span characteristics even at a relatively low power.

Hereinafter, the embodiments are illustrated in more detail with reference to examples. However, these examples are exemplary, and the present disclosure is not limited thereto.

Example 1

An indium-tin oxide (ITO) layer is deposited on a glass substrate, a hole injection layer is formed thereon by spin-coating poly (3,4-ethylenedioxythiophene):poly(styrene sulfonate) (PEDOT:PSS) to be 30 nm thick, and a hole transport layer is formed thereon by spin-coating poly(9,9-dioctylfluorene-co-N-(4-butylphenyl)diphenylamine) (TFB) to be 25 nm thick.

Separately from the above, each composition for first and second emission layers is prepared. First, octane is mixed with a blue quantum dot (ZnTeSe) and a surfactant for a first ligand (zinc N,N-diethyldithio carbamate) to prepare the composition for a first emission layer, wherein N,N-diethyldithio carbamate group (a ligand compound derived from thiol-based compound) as the first ligand is attached to the surface of the blue quantum dot (ZnTeSe).

On the other hand, ethanol is mixed with a blue quantum dot (ZnTeSe) and a surfactant for a second ligand (11-mercaptoundecanol) to prepare the composition for a second emission layer, wherein 11-hydroxy-1-undecanthiolate (a ligand compound derived from thiol-based compound) as the second ligand is attached to the surface of the blue quantum dot (ZnTeSe).

The composition for a first emission layer is coated on the hole transport layer, the composition for a second emission layer is coated directly on the composition for a first emission layer, and then, both of the compositions are dried at 80° C. for 30 minutes under a nitrogen atmosphere to form both first and second emission layers on the hole transport layer. The first emission layer is about 15 nm thick, and the second emission layer is about 10 nm thick.

Subsequently, an electron transport layer is formed on the emission layer by co-depositing a compound represented by Chemical Formula 3 and a pyrazole-based compound (Novaled Dopant n-side material 77, obtained from Novaled) in a weight ratio of 3:1 under vacuum condition. The formed electron transport layer is about 36 nm thick.

Then, an about 100 nm-thick aluminum (Al) layer is deposited on the electron transport layer to ultimately manufacture an electroluminescent device including the double emission layer (the first and second emission layers) of Example 1.

Example 2

An electroluminescent device of Example 2 including a double emission layer (first and second emission layers) is manufactured according to the same method as Example 1 except that oleic acid is used instead of the zinc N,N-diethyldithiocarbamate as a first ligand.

Comparative Example 1

An electroluminescent device of Comparative Example 1 including a single emission layer instead of the double emission layer of the first and second emission layers is manufactured according to the same method as Example 1 except that the composition for a first emission layer wherein zinc N,N-diethyldithiocarbamate is attached to a blue quantum dot is used to form a single emission layer.

Comparative Example 2

An electroluminescent device of Comparative Example 2 including a single emission layer is manufactured according to the same method as Comparative Example 1 except that the composition for a second emission layer wherein 11-mercaptoundecanol as a surfactant for a second ligand to form the single emission layer.

Comparative Example 3

An electroluminescent device of Comparative Example 3 including a single emission layer is manufactured according to the same method as Comparative Example 1 except that oleic acid is used instead of the zinc N,N-diethyldithiocarbamate as a first ligand.

Figure 5:
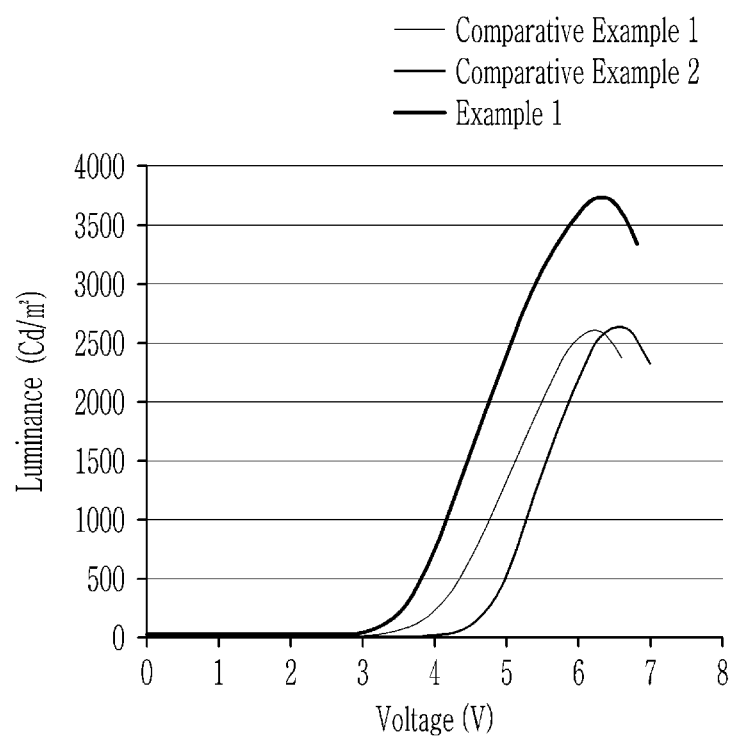
FIG. 5 is a graph of luminescence (candelas per square meter ($Cd/m^2$)) versus voltage (volts (V)) of the electroluminescent devices of Example 1 and Comparative Examples 1 and 2.
Figure 6:
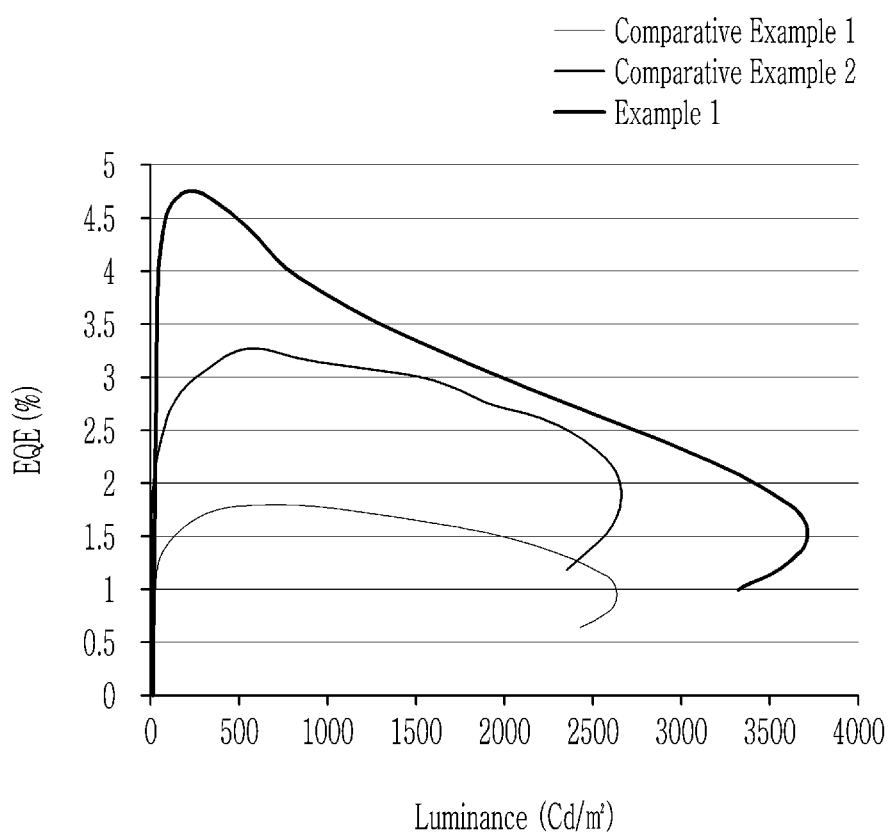
FIG. 6 is a graph of external quantum efficiency (EQE (percent (%)) versus luminescence ($Cd/m^2$)) of the electroluminescent device of Example 1 and Comparative Example 1 and Comparative Example 2.
Figure 7:
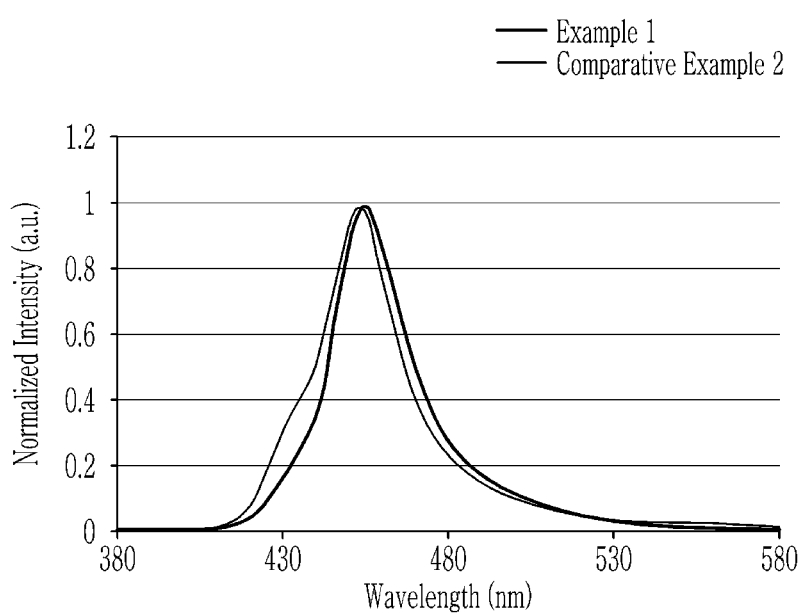
FIG. 7 is a graph of normalized intensity (arbitrary units (a.u.)) versus wavelength (nanometers (nm)) of the electroluminescent devices of Example 1 and Comparative Example 2.

Evaluation 1: Comparison of Light Emitting Characteristics of Double Emission Layer and Single Emission Layer Light emitting characteristics of the electroluminescent devices of Example 1 and Comparative Examples 1 and 2 are evaluated. FIG. 5 shows a luminance change depending on a voltage, and FIG. 6 shows an external quantum efficiency change depending on luminance. FIG. 7 shows an intensity change of each electroluminescent device of Example 1 and Comparative Example 2 depending on a wavelength.

Referring to FIG. 5, the electroluminescent device of Example 1 exhibits relatively high luminance compared with the electroluminescent devices of Comparative Examples 1 and 2. The electroluminescent device including a double emission layer of Example 1 may exhibit relatively high luminance within a voltage range that may be used in practice.

Referring to FIG. 6, the electroluminescent device of Example 1 exhibits improved external quantum efficiency at less than or equal to about 4,000 nits (candelas per square meter), less than or equal to about 3,500 nits, less than or equal to about 3,000 nits, less than or equal to about 2,500 nits, less than or equal to about 2,000 nits, less than or equal to about 1,500 nits, less than or equal to about 1,000 nits, or less than or equal to about 500 nits compared with the electroluminescent devices of Comparative Examples 1 and 2. An electroluminescent device manufactured by applying a double emission layer as shown in Example 1 exhibits improved luminous efficiency and, for example, improved luminous efficiency at less than or equal to about 1,500 nits compared with a single layer electroluminescent device.

Referring to FIG. 7, the electroluminescent device of Comparative Example 2 has a profile in a graph of normalized intensity (a.u.) versus wavelength (nm) that protrudes convexly toward the left (i.e., in a direction of decreasing wavelength) in a wavelength region of about 400 nm to 450 nm. Without being bound by theory, the reason is that holes are slowly transported from the hole transport layer (TFB layer) to a single emission layer of the electroluminescent device of Comparative Example 2.

The electroluminescent device of Example 1 includes a second emission layer to which 11-mercaptoundecanol as a second ligand is attached but has a profile in a graph of normalized intensity (a.u.) versus wavelength (nm) that does not protrude but increases in the corresponding wavelength region. Without being bound by theory, the reason is that the first emission layer contacting the hole transport layer (TFB layer) is believed to help hole transportation to the second emission layer.

An electroluminescent device manufactured by applying a double emission layer as shown in Example 1 may exhibit improved color purity compared with a single layer electroluminescent device.

Evaluation 2: Comparison of Life-Span Characteristics of Double Emission Layer and Single Emission Layer Life-span characteristics of each electroluminescent device of Examples 1 and 2 and Comparative Examples 1-3 are evaluated. First, a luminance change of the electroluminescent device depending on driving time is measured by radiating light having luminance of 100 nits (candelas per square meter) in a blue wavelength region of 380 nm to 488 nm, and the result is shown in FIG. 8.

Figure 8:
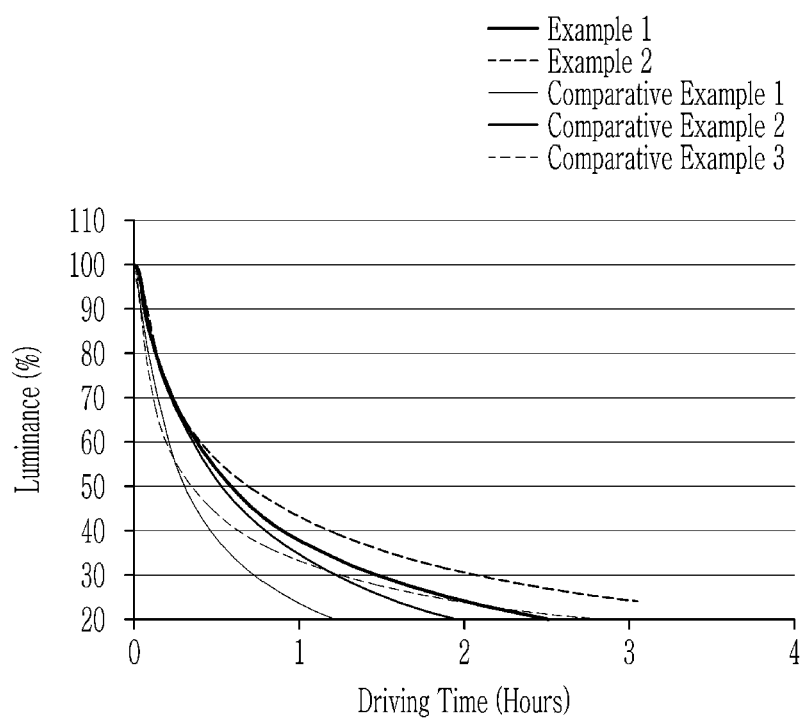
FIG. 8 is a graph of luminance (%) versus driving time (Hours) of the electroluminescent devices of Examples 1 and 2 and Comparative Examples 1-3.

T95, the time at which initial luminance becomes 95%, and T50, the time at which initial luminance becomes 50%, in FIG. 8 are respectively shown and provided in Table 1.

TABLE 1

|  | T95 (hours (hr)) | T50 (hr) |
| --- | --- | --- |
| Example 1 | 0.04 | 0.59 |
| Example 2 | 0.04 | 0.69 |
| Comparative Example 1 | 0.03 | 0.31 |
| Comparative Example 2 | 0.05 | 0.53 |
| Comparative Example 3 | 0.03 | 0.35 |

Referring to FIG. 8 and Table 1, the electroluminescent devices of Examples 1 and 2 exhibit improved life-span characteristics compared with the electroluminescent devices of Comparative Examples 1-3.

Regarding the electroluminescent devices of Example 1 and Comparative Examples 1-3, each initial driving voltage, each driving voltage at T50, and each driving voltage difference between the initial driving voltage and the driving voltage at T50 are calculated and shown in Table 2.

TABLE 2

|  | Initial driving voltage (V) | Driving voltage at T50 (V) | Initial driving voltage- driving voltage at T50 (V) |
| --- | --- | --- | --- |
| Example 1 | 3.930 | 3.922 | 0.008 |
| Comparative Example 1 | 3.705 | 3.820 | −0.115 |
| Comparative Example 2 | 4.236 | 4.205 | 0.031 |
| Comparative Example 3 | 4.815 | 4.748 | 0.067 |

Referring to Table 2, the electroluminescent device of Example 1 exhibits a driving voltage decrease at T50 compared with the electroluminescent devices of Comparative Examples 2 and 3. Referring to FIG. 8, Table 1, and Table 2 together, the electroluminescent device of Example 1 exhibits improved life-span compared with the electroluminescent devices of Comparative Examples 1-3.

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

| <Description of symbols> | |
|---|---|
| 10: electroluminescent device | 100: substrate |
| 110: first electrode | 120: hole injection layer |
| 130: hole transport layer | 140: first emission layer |
| 141: first light emitting particle | 150: second emission layer |
| 151: second light emitting particle | 160: electron transport layer |
| 170: second electrode | 180: third emission layer |
| 181: third light emitting particle | |

What is claimed is:

1. An electroluminescent device, comprising
a first electrode;
a hole transport layer disposed on the first electrode;
a first emission layer disposed on the hole transport layer, the first emission layer comprising a first light emitting particle on which a first ligand having a hole transporting property is attached;
a second emission layer disposed on the first emission layer, the second emission layer comprising a second light emitting particle on which a second ligand having an electron transporting property is attached;
an electron transport layer disposed on the second emission layer; and
a second electrode disposed on the electron transport layer,
wherein a solubility of the first ligand in a solvent is different than a solubility of the second ligand in the solvent,
wherein the first ligand is soluble in a hydrophobic solvent, and the second ligand is soluble in a hydrophilic solvent,
wherein the second ligand comprises a ligand compound derived from a thiol-based compound, a halide-based compound, an alkyl-based compound, an amine-based compound, a carbazole-based compound, a mercapto-based compound, or a combination thereof, and
wherein the first ligand comprises an oleic acid.

2. The electroluminescent device of claim 1, wherein a hole mobility of the first emission layer is faster than a hole mobility of the second emission layer.

3. The electroluminescent device of claim 1, wherein an electron mobility of the second emission layer is faster than an electron mobility of the first emission layer.

4. The electroluminescent device of claim 1, wherein the hydrophilic solvent comprises methanol, ethanol, isopropyl alcohol, acetone, butanol, dimethyl formamide, dimethyl sulfoxide, water, acetonitrile, or a combination thereof.

5. The electroluminescent device of claim 1, wherein the hydrophobic solvent comprises octane, heptane, nonane, hexane, xylene, toluene, chlorobenzene, chloroform, cyclohexane, or a combination thereof.

6. The electroluminescent device of claim 1, wherein at least one of the first light emitting particle or the second light emitting particle has a core-shell structure.

7. The electroluminescent device of claim 1, wherein the first light emitting particle and the second light emitting particle independently comprise a Group II-VI compound that does not comprise Cd, a Group III-V compound, a Group IV-VI compound, a Group IV element or compound, a Group compound, a Group I-II-IV-VI compound that does not comprise Cd, or a combination thereof.

8. The electroluminescent device of claim 1, wherein the first emission layer and the second emission layer emit a first light belonging to a predetermined wavelength region.

9. The electroluminescent device of claim 8, wherein the first light belongs to a first wavelength region of about 380 nanometers to about 488 nanometers, a second wavelength region of about 490 nanometers to 510 nanometers, a third wavelength region of greater than 510 nanometers to about 580 nanometers, a fourth wavelength region of about 582 nanometers to about 600 nanometers, or a fifth wavelength region of about 620 nanometers to about 680 nanometers.

10. The electroluminescent device of claim 1, wherein each of the first emission layer and the second emission layer has a thickness of about 10 nanometers to about 100 nanometers.

11. The electroluminescent device of claim 1, wherein the second emission layer is disposed directly on the first emission layer.

12. An electroluminescent device, comprising
a first electrode;
a hole transport layer disposed on the first electrode;
a first emission layer disposed on the hole transport layer, the first emission layer comprising a first light emitting particle on which a first ligand having a hole transporting property is attached;
a second emission layer disposed on the first emission layer, the second emission layer comprising a second light emitting particle on which a second ligand having an electron transporting property is attached;
a third emission layer disposed between the first emission layer and the second emission layer, the third emission layer comprising a third light emitting particle on which a third ligand having lower electron transporting property than that of the second ligand and having lower hole transporting property than that of the first ligand is attached;
an electron transport layer disposed on the second emission layer; and a second electrode disposed on the electron transport layer,
wherein a solubility of the third ligand in a solvent is different than a solubility of the first ligand in the solvent and different than a solubility of the second ligand in the solvent,
wherein when the third ligand is soluble in a hydrophobic solvent, each of the first ligand and the second ligand is soluble in a hydrophilic solvent, and when the third ligand is soluble in a hydrophilic solvent, each of the first ligand and the second ligand is soluble in a hydrophobic solvent, wherein the second ligand or the third ligand independently comprises a ligand compound derived from a thiol-based compound, a halide-based compound, an alkyl-based compound, an amine-based compound, a carbazole-based compound, a mercapto-based compound, or a combination thereof, and wherein the first ligand comprises an oleic acid.

13. The electroluminescent device of claim 12, wherein the third emission layer is disposed directly on the first emission layer and the second emission layer is disposed directly on the third emission layer.

14. The electroluminescent device of claim 12, wherein a hole mobility of the third emission layer is slower than a hole mobility of the first emission layer.

15. The electroluminescent device of claim 12, wherein an electron mobility of the third emission layer is slower than an electron mobility of the second emission layer.

16. The electroluminescent device of claim 12, wherein an electron mobility of the third ligand is about $10^{-10}$ square centimeters per volt-second to about $10^{-4}$ square centimeters per volt-second.

17. The electroluminescent device of claim 12, wherein the first emission layer, the second emission layer, and the third emission layer emit a first light belonging to a predetermined wavelength region.

18. The electroluminescent device of claim 12, wherein the third emission layer has a thickness of about 0.1 nanometers to about 100 nanometers.

19. A display device comprising the electroluminescent device of claim 1.

20. A method of forming an electroluminescent device, the method comprising
- disposing a hole transport layer on a first electrode;
- disposing a first emission layer on the hole transport layer, the first emission layer comprising a first light emitting particle on which a first ligand having a hole transporting property is attached;
- disposing a second emission layer on the first emission layer, the second emission layer comprising a second light emitting particle on which a second ligand having an electron transporting property is attached;
- disposing an electron transport layer on the second emission layer; and
- disposing a second electrode on the electron transport layer,
- wherein a solubility of the first ligand in a solvent is different than a solubility of the second ligand in the solvent,
- wherein the first ligand is soluble in a hydrophobic solvent, and the second ligand is soluble in a hydrophilic solvent, and
- wherein the second ligand comprises a ligand compound derived from a thiol-based compound, a halide-based compound, an alkyl-based compound, an amine-based compound, a carbazole-based compound, a mercapto-based compound, or a combination thereof, and
- wherein the first ligand comprises an oleic acid.

* * * * *